United States Patent
Umeno et al.

(10) Patent No.: US 9,848,511 B2
(45) Date of Patent: Dec. 19, 2017

(54) ELECTRONIC DEVICE

(71) Applicant: DENSO CORPORATION, Kariya, Aichi-pref. (JP)

(72) Inventors: Masafumi Umeno, Okazaki (JP); Satoshi Yamauchi, Kariya (JP)

(73) Assignee: DENSO CORPORATION, Kariya (JP)

(*) Notice: Subject to any disclaimer, the term of this patent is extended or adjusted under 35 U.S.C. 154(b) by 0 days.

(21) Appl. No.: 14/836,205

(22) Filed: Aug. 26, 2015

(65) Prior Publication Data
US 2016/0088759 A1 Mar. 24, 2016

(30) Foreign Application Priority Data

Sep. 18, 2014 (JP) .................................. 2014-190153

(51) Int. Cl.
*H05K 5/00* (2006.01)
*H05K 7/20* (2006.01)

(52) U.S. Cl.
CPC ......... *H05K 7/20409* (2013.01); *H05K 5/006* (2013.01)

(58) Field of Classification Search
CPC ............................. H05K 5/006; H05K 7/20409
USPC .......................................... 361/759, 801, 803
See application file for complete search history.

(56) References Cited

U.S. PATENT DOCUMENTS

| | | | | |
|---|---|---|---|---|
| 3,661,291 A * | 5/1972 | Hetzer | ................... | B65D 59/02 138/96 T |
| 3,978,045 A | 8/1976 | Okamoto et al. | | |
| 5,420,378 A * | 5/1995 | Estes | ..................... | H05K 1/0215 174/261 |
| 5,750,936 A * | 5/1998 | Wheatley | .............. | F16B 41/002 174/138 G |
| 6,262,887 B1 * | 7/2001 | Lee | ........................ | G06F 1/1616 361/679.27 |
| 6,320,629 B1 * | 11/2001 | Hatano | ................... | G02B 27/26 348/E13.033 |
| 6,908,270 B1 * | 6/2005 | Iwata | ..................... | F16B 35/047 411/188 |
| 8,070,404 B1 * | 12/2011 | Schluter | ................ | F16B 39/282 411/368 |
| 8,657,242 B2 * | 2/2014 | Peng | ...................... | H05K 7/142 174/138 E |

(Continued)

FOREIGN PATENT DOCUMENTS

| | | |
|---|---|---|
| JP | S61-034787 U1 | 3/1986 |
| JP | 1996-288672 A | 11/1996 |

(Continued)

*Primary Examiner* — Hung S Bui
(74) *Attorney, Agent, or Firm* — Posz Law Group, PLC

(57) ABSTRACT

A base plate for a circuit board assembly, to which an electronic component is soldered, has a through-hole. A screw hole is formed in a housing, to which the base plate is fixed by screw members. Multiple screw-fixing portions are formed in an electronic device, so that each of the screw members is inserted through each of the through-holes of the base plate and fixed to the housing in each of the screw-fixing portions. Two projections are formed at a first casing of the housing in each of the screw-fixing portions, so that the base plate is in contact with the first casing at two contacting points formed by the projections. The projections are symmetrically formed with respect to a center of the screw hole.

12 Claims, 11 Drawing Sheets

(56) References Cited

U.S. PATENT DOCUMENTS

| | | | |
|---|---|---|---|
| 8,937,814 B2 * | 1/2015 | Tu | G06F 1/184 |
| | | | 174/138 E |
| 9,007,779 B2 * | 4/2015 | Yamamoto | G11B 25/043 |
| | | | 361/752 |
| 2006/0257229 A1 * | 11/2006 | Bucciferro | F16B 5/02 |
| | | | 411/187 |
| 2012/0155040 A1 | 6/2012 | Yamamoto et al. | |

FOREIGN PATENT DOCUMENTS

| | | |
|---|---|---|
| JP | H09-324812 A | 12/1997 |
| JP | 10-145060 A | 5/1998 |
| JP | 2004-327784 A | 11/2004 |
| JP | 2009-239091 A | 10/2009 |

\* cited by examiner

ELECTRONIC DEVICE

CROSS REFERENCE TO RELATED APPLICATION

This application is based on Japanese Patent Application No. 2014-190153 filed on Sep. 18, 2014, the disclosure of which is incorporated herein by reference.

FIELD OF TECHNOLOGY

The present disclosure relates to an electronic device having a housing and a circuit board assembly, which is accommodated in the housing and fixed thereto by means of screws.

BACKGROUND

In recent years, an electronic device is made smaller and smaller and becomes more sophisticated. A temperature change inside of a housing of the electronic device becomes relatively larger as a result of such a smaller-sized and more-sophisticated structure of the electronic device. Accordingly, expansion and/or contraction of a printed circuit board have become a problem. A stress generated by the expansion and/or the contraction of the printed circuit board is applied to soldering portions of an electronic part or component mounted to the printed circuit board. Then, reliability of electrical connection at the soldering portions may be decreased.

In most of the electronic devices installed in a vehicle, the printed circuit board is fixed to the housing by screw members. It has been investigated and proposed that a torque for screwing the screw member is reduced so as to decrease a fastening force of the screw member. Then, it becomes possible that the printed circuit board moves in a surface direction thereof and thereby the stress applied to the soldering portion is decreased. However, when the fastening force of the screw member becomes smaller, the screw member may be loosened by the stress generated by the expansion and/or contraction of the printed circuit board. In such a case, a noise may be generated due to a movement or vibration of the printed circuit board within the housing and/or heat radiating performance may be decreased due to a change of a relative position between the printed circuit board and the housing.

For example, Japanese Patent Publication No. H10-145060 discloses an electronic device, which has a housing, two printed circuit boards (a first and a second printed circuit boards), a first and a second connectors respectively mounted to the first and the second printed circuit boards and electrically connected to each other, multiple screws for fixing each of the printed circuit boards to the housing, and so on. Each of the connectors is soldered to the respective printed circuit boards. Multiple supporting pillars are formed in the housing, wherein a screw portion is formed at a forward end of each supporting pillar. A first printed circuit board has multiple through-holes so that each of the forward ends of the supporting pillars is inserted through the through-holes. A screw member is screwed into each threaded portion of the supporting pillar in order to hold the first printed circuit board in the housing. The first printed circuit board is held between screw heads and supporting wall portions of the housing, so that the first printed circuit board can move in its surface direction with respect to the housing. The first connector soldered to the first printed circuit board is electrically connected to the second connector soldered to the second printed circuit board. Since the first printed circuit board can move with respect to the second printed circuit board, the first connector of the first printed circuit board can be easily moved to a proper position with respect to the second connector of the second printed circuit board, when the first and the second connectors are electrically connected to each other. Accordingly, any stress to be applied to soldering portions of the first and the second connectors can be reduced.

In the electronic device of the above prior art, the first printed circuit board is elastically bent in a thickness direction of the printed circuit board by a fastening force of the screw member. The printed circuit board is held in the housing between the screw heads of the screw members and the supporting wall portions of the housing by a reaction force of the printed circuit board. Therefore, the printed circuit board can move in its surface direction not only during a manufacturing process (including a step for electrically connecting the first and the second connectors of the two printed circuit boards to each other) but also when the printed circuit board is expanded and/or contracted during its actual use.

However, as explained above, the printed circuit board is elastically bent in the thickness direction by the fastening force of the screw member. As a result, stress caused by a bending force for the printed circuit board may be applied to soldering portions for the connector and other electronic components. Reliability for electrical connection at the soldering portions may be decreased.

SUMMARY OF THE DISCLOSURE

The present disclosure is made in view of the above problem. It is an object of the present disclosure to provide an electronic device, according to which it is possible to suppress a loosening of a screw member to be caused by expansion and/or contraction of a printed circuit board and it is possible to suppress a decrease of reliability for electrical connection at a soldering portion of an electronic component to the printed circuit board.

According to the present disclosure, the electronic device has the following features in order to achieve the above object. The present disclosure, however, is not limited to the electronic devices explained below with reference to multiple embodiments.

According to one of features of the present disclosure, an electronic device is composed of;

a base plate, which has multiple through-holes and to which multiple electronic components are soldered;

a housing having multiple screw holes and accommodating the base plate; and multiple screw members, each of which is inserted through each of the through-holes of the base plate and screwed into each of the screw holes of the housing for fixing the base plate to the housing, wherein the electronic device has multiple screw-fixing portions, at each of which the base plate is respectively fixed to the housing by the screw member.

Two projections are formed in each of the screw-fixing portions at one of the screw member, the base plate and the housing, in order that the screw member and the base plate, or the base plate and the housing, are in contact with each other at two contacting points respectively formed by the projections.

The projections in each of the screw-fixing portions are located at such positions, which are symmetric with respect to a screw-hole center of the screw hole.

According to the above structure, a force, which is generated by expansion or contraction of the base plate, is applied to each of the contacting points at the projections. Each of the forces is applied to the screw member at each of the contacting points as a rotative force. Each of the rotative forces, which is equal to each other, is applied to the screw member at the respective contacting points in a rotating direction different from each other. In other words, each of the rotative forces at the respective contacting points (formed by the projections) cancels each other.

As a result, it is possible to decrease the torque for fastening the screw member, so that the base plate becomes capable of moving in its surface direction due to the decreased fastening force of the screw member. Then, the stress to be applied to the soldering portion is decreased. At the same time, it becomes possible to suppress a loosening of the screw member.

According to another feature of the present disclosure, each of the projections is elongated on a plane of the surface, on which the projections are formed, in a direction different from an alignment direction in which the projections are located. And each of the projections is in a surface-contact with an opposing member (for example, the base plate when the projections are formed in the screw member).

According to the above feature, it is possible to prevent the screw member from being inclined with respect to the base plate during a manufacturing process, in which the screw member is screwed into the screw hole of the housing, even in a case that the projections are arranged to be symmetric with respect to the screw-hole center.

According to a further feature of the present disclosure, two projections are located at such positions, which are symmetric with respect to a line connecting a base-plate center and a screw-hole center. In other words, a distance between one of the projections and the base-plate center is equal to a distance between the other of the projections and the base-plate center.

According to the above feature, a force for rotating the screw member is not generated at an additional contacting point, at which the screw member is in contact with the base plate in addition to the contacting points formed by the respective projections. Therefore, it is possible to prevent the loosening of the screw member.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION OF THE EMBODIMENTS

Figure 1:
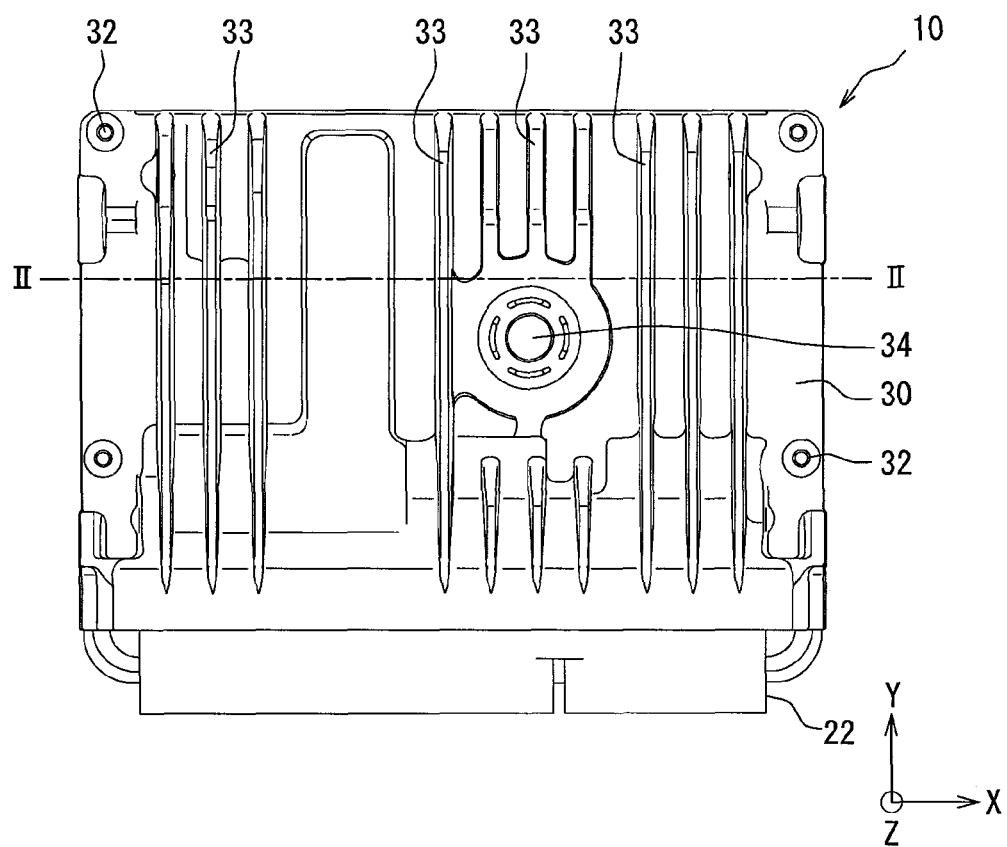
FIG. 1 is a top plan view schematically showing a structure of an electronic device according to a first embodiment of the present disclosure.

The present disclosure will be explained hereinafter by way of multiple embodiments with reference to the drawings. The same reference numerals are given to the same or similar structure and/or portion in order to avoid repeated explanation.

In the drawings, a thickness direction of a circuit board assembly is referred to as a Z-direction. One of directions perpendicular to the Z-direction is referred to as an X-direction and a direction perpendicular to both of the Z-direction and the X-direction is referred to as a Y-direction. A shape on a plane formed by the X-direction and the Y-direction is referred to as a planar shape, unless otherwise defined. The plane formed by the X-direction and the Y-direction corresponds to a surface direction of the circuit board assembly.

First Embodiment

A structure of an electronic device 10 according to a first embodiment of the present disclosure will be explained.

Figure 2:
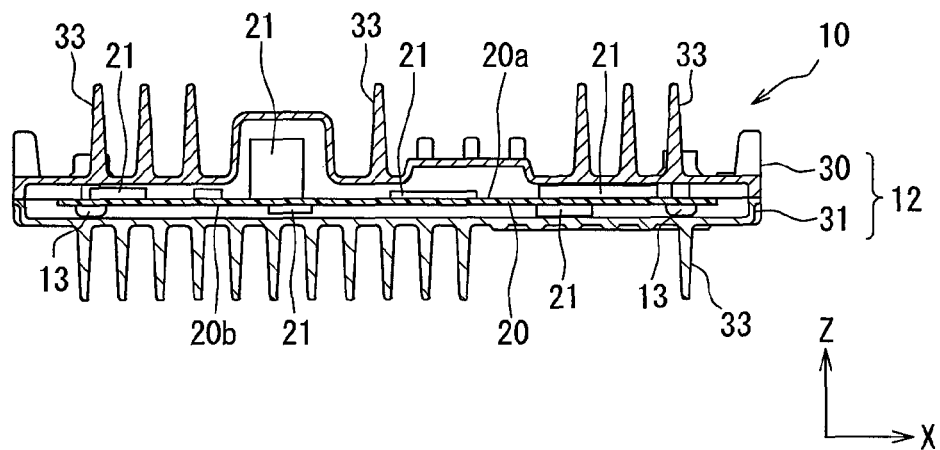
FIG. 2 is a schematic cross sectional view taken along a line II-II in FIG. 1.
Figure 3:
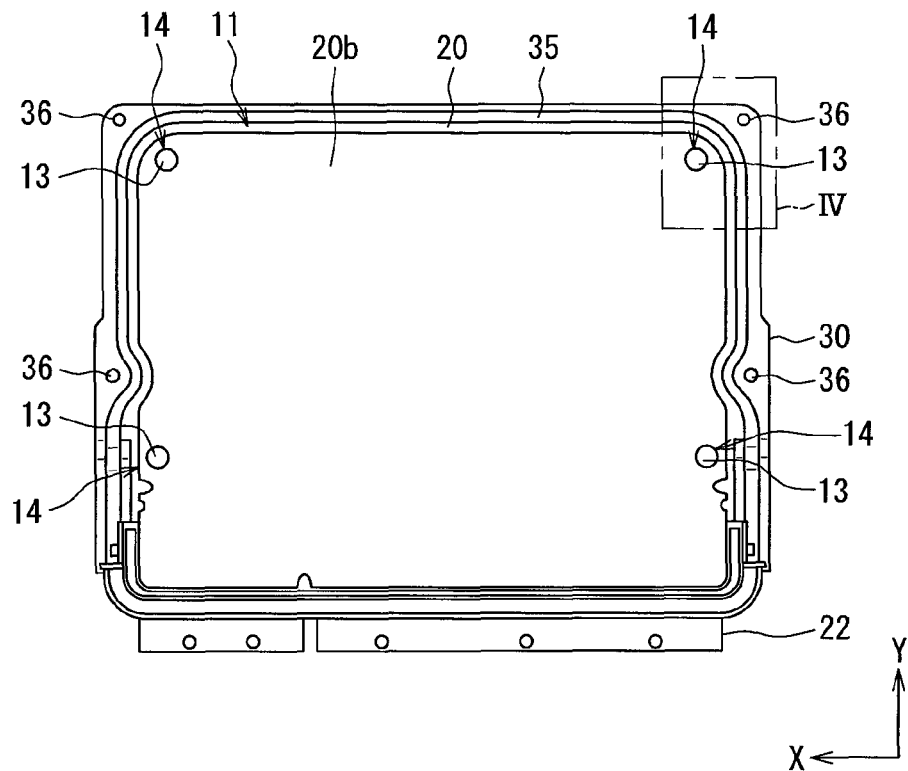
FIG. 3 is a plan view schematically showing a base plate of a circuit board assembly fixed to an upper-side casing of an electronic device, more exactly, the base plate of the circuit board assembly fixed to the upper-side casing when viewed from a lower side thereof.

The electronic device 10 shown in FIGS. 1 to 3 is an electronic control unit (hereinafter, the ECU) for an engine of an automotive vehicle. The electronic device 10 has a water-proof structure.

The electronic device 10 is composed of a circuit board assembly 11, a housing 12 for accommodating the circuit board assembly 11, multiple screw members 13 for fixing the circuit board assembly 11 to the housing 12 and so on.

The circuit board assembly 11 is composed of a base plate 20, multiple electronic components 21 and so on. The base plate 20 is composed of a printed circuit board, wherein electric wiring patterns are formed in and/or on an electrical insulating plate made of resin, ceramic material or the like. The multiple electronic components 21 are mounted to the base plate 20, so that electric circuits are formed by the electric wiring patterns and the electronic components 21 on the base plate 20.

The multiple electronic components 21, which include micro-computers, switching devices (such as, MOSFET), resistors, capacitors and so on, are mounted to the base plate 20. The electronic components 21 are mounted to at least one of an upper-side surface 20a (hereinafter, the first board surface 20a) and a lower-side surface 20b (hereinafter, the second board surface 20b) of the base plate 20. In the present embodiment, the electronic components 21 are mounted to both of the first and the second board surfaces 20a and 20b of the base plate 20. At least, in some of the multiple electronic components 21, terminals of those components (externally-connected terminals) are soldered to lands (electrodes), each of which is formed as a part of the electric wiring patterns.

A connector 22 is also mounted to the base plate 20 in order to electrically connect the electric circuits formed on the base plate 20 to external devices. A portion of the connector 20, which is electrically connected to the base plate 20, is accommodated in the housing 12. Another portion of the connector 20, which is connected to the external devices, is exposed to an outside of the housing 12 through an opening portion (not shown) formed in the housing 12.

The housing 12 is composed of two casings divided in the Z-direction, that is, an upper-side casing 30 (hereinafter, a first casing 30) of a box shape having an open end on a lower side thereof and a lower-side casing 31 (hereinafter, a second casing 31) for closing the open end of the first casing 30. The first casing 30 is fixed to the second casing 31 to form the housing 12, which has an inside space for accommodating the circuit board assembly 11. In the present embodiment, the first casing 30 is fixed to the second casing 31 to form the housing 12 by multiple screw members 32. As shown in FIG. 1, the first and the second casings 30 and 31 are fixed to each other by the screw members 32 at four screw-fixing portions.

The housing 12 is made of metal (such as, aluminum) or resin (such as, PPS=polyphenylene sulphide). Metal is more preferable in view of heat radiation from the electronic components 21. Some of the electronic components 21 are thermally connected to the housing 12 (for example, made of metal) via heat-radiating gel, which is a mixture of zinc oxide and silicon and has electrical insulating properties.

The first casing 30 is opposed to the first board surface 20a of the base plate 20 in the Z-direction, while the second casing 31 is opposed to the second board surface 20b of the base plate 20 in the Z-direction. The first casing 30 has multiple heat-radiating fins 33 and a breathing filter 34. The second casing 31 also has multiple heat-radiating fins 33. The heat-radiating fins 33, which increase a surface area of the housing 12 and thereby increase radiation performance, are formed so as to outwardly project. The breathing filter 34 communicates an inside and an outside of the housing 12 with each other for the purpose of air ventilation. The breathing filter 34 prohibits pass-through of liquid (such as, water) and only allows pass-through of air.

As shown in FIG. 3, on the X-Y plane, the first casing 30 has the inside space for accommodating the circuit board assembly 11 and a groove 35, in which a sealing member (not shown) is inserted. Although not shown in the drawing, the groove 35 is also formed in a housing of the connector 22. The groove 35, which is formed in a flanged portion of the first casing 30 and the connector 22 and recessed in an upper-side direction of the first casing 30 (in the Z-direction), surrounds the circuit board assembly 11, namely surrounds the inside space of the housing 12. Although not shown in the drawing, a projection is formed in the second casing 31 at a position corresponding to the groove 35. In a condition that the sealing member (not shown) is arranged in the groove 35 and the first casing 30 is fixed to the second casing 31, the projection formed in the second casing 31 is partly or fully inserted into the groove 35. The first and the second casings 30 and 31, in other words, the housing 12 and the housing of the connector 22, are water-tightly sealed.

The first casing 30 has multiple screw holes 36 in the flanged portion thereof at positions outside of the groove 35. Each of the screw members 32 is inserted into the respective screw holes 36. As shown in FIG. 3, the circuit board assembly 11 is arranged in the inside of the groove 35. The circuit board assembly 11 is arranged in the first casing 30 in such a manner that the first board surface 20a of the base plate 20 is opposed to the first casing 30 in the Z-direction. The base plate 20 (that is, the circuit board assembly 11) is fixed to the first casing 30 (that is, the housing 12) by multiple screw members 13. Accordingly, each of the screw members 13, the base plate 20 and the housing 12 (the first casing 30) form a screw-fixing portion 14.

As shown in FIG. 3, there are four screw-fixing portions 14 in the present embodiment. Each of the screw-fixing portions 14 is provided at a position close to an outer peripheral side of the base plate 20. More exactly, two of the screw-fixing portions 14 are provided in the base plate 20 of an almost rectangular shape on the X-Y plane at positions close to each corner of the base plate 20. In other words, two of the screw-fixing portions 14 are located on one of the outer peripheral sides (an upper side in FIG. 3), which is opposite to another peripheral side (a lower side in FIG. 3) to which the connector 22 is mounted. The remaining two screw-fixing portions 14 are provided in the base plate 20 at such positions, each of which is close to a further peripheral side of the base plate 20 (a right hand and a left hand in FIG. 3) and each of which is separated from each corner of the base plate 20 on the other outer peripheral side (the lower side in FIG. 3), that is, separated from the connector 22 in the Y-direction.

Figure 4:
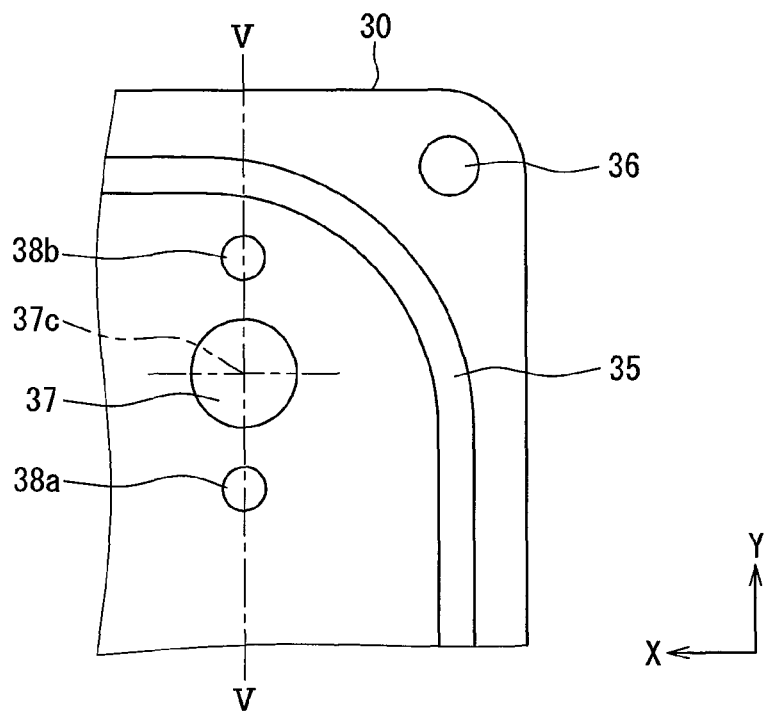
FIG. 4 is an enlarged schematic view showing a portion IV of the upper-side casing surrounded by a one-dot-chain line in FIG. 3, wherein the circuit board assembly is removed.
Figure 5:
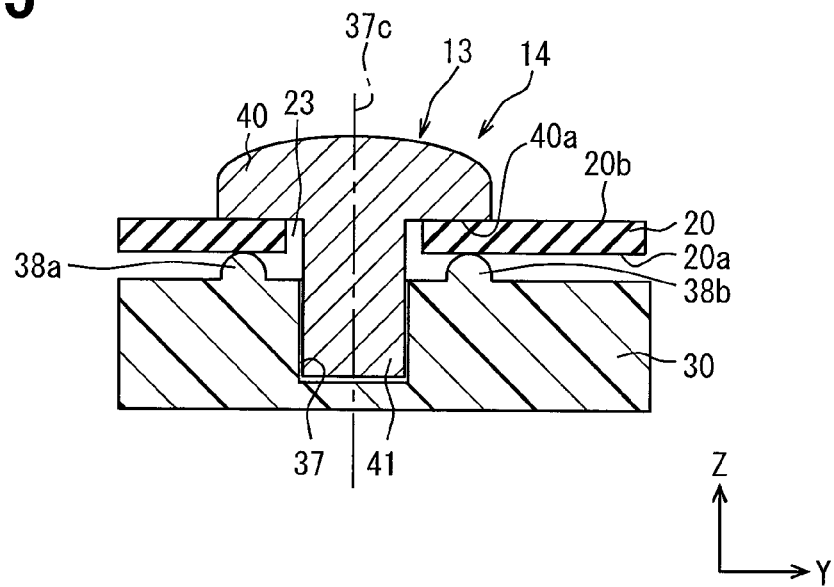
FIG. 5 is a schematic cross sectional view, taken along a line V-V in FIG. 4, showing a screw-fixing portion including a screw member and its related members.

A structure of the screw-fixing portion 14 will be further explained with reference to FIGS. 4 and 5. FIG. 4 shows only the first casing 30 belonging to a portion IV surrounded by a one-dot-chain line in FIG. 3. FIG. 5 shows a structure of a cross section, which is taken along a line V-V in FIG. 4, for the screw-fixing portion 14 including the screw member 13 and its related members. In FIG. 5, the groove 35 is omitted for the sake of simplicity. Although only one screw-fixing portion 14 is explained hereinafter, each of the remaining screw-fixing portions 14 has the same structure.

As shown in FIG. 4, a screw hole 37, into which the screw member 13 is inserted, is formed in the first casing 30. An internal thread is formed in the screw hole 37 and the screw member 13 having an external thread is screwed into the screw hole 37. In the present embodiment, as shown in FIG. 5, the screw hole 37 is formed with a closed bottom end and has a predetermined depth. The screw member 13 may be replaced by a bolt and then a nut may be embedded in the screw hole 37. A shape of an opening of the screw hole 37 is a circular. In FIG. 4, a reference numeral 37c designates a center of the screw hole 37 (hereinafter, the screw-hole center 37c). In FIG. 4, a cross point between a one-dot-chain line and a two-dot-chain line corresponds to the screw-hole center 37c.

The first casing 30 has a first projection 38a and a second projection 38b, so that the first board surface 20a of the base plate 20 is in contact with the first casing 30 at two positions (two contacting points) of the first and the second projections 38a and 38b formed in the screw fixing portion 14. The first and the second projections 38a and 38b are arranged in the screw fixing portion 14 in a symmetrical manner with respect to the screw-hole center 37c. Each of the projections 38a and 38b has a semi-spherical cross section in the present embodiment on a Y-Z plane, as shown in FIG. 5. Each of the projections 38a and 38b is in a point-contact with the first board surface 20a of the base plate 20. The projections 38a and 38b are integrally formed with the first casing 30 as apart thereof, when the first casing 30 is manufactured, for example, by an aluminum die-cast method.

As shown in FIG. 5, the screw member 13 has a screw head 40 and a screw shaft 41 extending from the screw head 40 in the Z-direction. Each of the screw head 40 and the screw shaft 41 has a circular shape in its cross section on the X-Y plane. A diameter of the screw head 40 is larger than that of the screw shaft 41. The external thread (not shown) is formed on an outer peripheral surface of the screw shaft 41. A contact-side surface portion 40a is formed at one axial end surface of the screw head 40 on a side opposing to the base plate 20, so that the contact-side surface portion 40a of the screw head 40 is in contact with the second board surface 20b of the base plate 20. The screw head 40 and the screw shaft 41, each of which has the circular cross section on the X-Y plane, are coaxial with each other. A coaxial center axis of the screw head 40 and the screw shaft 41 is a center axis of the screw member 13. In a condition that the screw member 13 is screwed into the screw hole 37, the center axis of the screw member 13 substantially coincides with the screw-hole center 37c.

The base plate 20 has multiple (four) through-holes 23, through each of which the screw member 13 is inserted. The through-hole 23 has a circular shape in its cross section on the X-Y plane and a diameter of the through-hole 23 is larger than that of the screw shaft 41.

A method for fixing the circuit board assembly 11 to the housing 12 by the screw members 13 will be explained.

The base plate 20 is positioned in the first casing 30 of the housing 12, so that a center of each through-hole 23 having the circular cross section almost coincides with the corresponding screw-hole center 37c. Each of the projections 38a and 38b is brought into contact with the first board surface 20a of the base plate 20. Then, each of the screw members 13 (more exactly, the screw shaft 41) is inserted through the respective through-hole 23 of the base plate 20, so that the screw members 13 are respectively screwed into and fastened to the screw holes 37. As a result, the base plate 20 is supported between the screw heads 40 of the screw members 13 and the projections 38a and 38b of the first casing 30.

As above, the circuit board assembly 11 is accommodated in the housing 12. In each of the screw-fixing portions 14, the screw member 13 is fastened to the screw hole 37 in such a way that the base plate 20 is allowed to move in its surface direction when the base plate 20 is expanded or contracted due to a change of temperature surrounding the electronic device 10.

Advantages of the electronic device 10 will be explained with reference to FIG. 6.

As explained above, the base plate 20 is expanded and/or contracted in the surface direction of the base plate 20, that is, in a direction along the X-Y plane, depending on the temperature change thereof. An amount of displacement of the base plate 20 becomes larger, as a distance from a center 20c of the base plate 20 (hereinafter, the base-plate center 20c) is longer. In other words, the amount of displacement of the base plate 20 at each screw-fixing portion 14 is in proportion to the distance between the corresponding screw-fixing portion 14 and the base-plate center 20c. In addition, if the base plate 20 is regarded as an elastic body, the amount of displacement of the base plate 20 is in proportion to a force of deformation. As a result, the force of the deformation at the screw-fixing portion 14 is in proportion to the distance between the screw-fixing portion 14 and the base-plate center 20c.

According to the present embodiment, two projections 38a and 38b are provided in each of the screw-fixing portions 14, so that the base plate 20 is in contact with the first casing 30 at two contacting points (38a and 38b) in one screw-fixing portion 14. The projections 38a and 38b are arranged in the symmetrical manner with respect to the screw-hole center 37c and located on a virtual line L1 passing through the screw-hole center 37c. In FIG. 6, the virtual line L1 is indicated by a two-dot-chain line.

Figure 6:
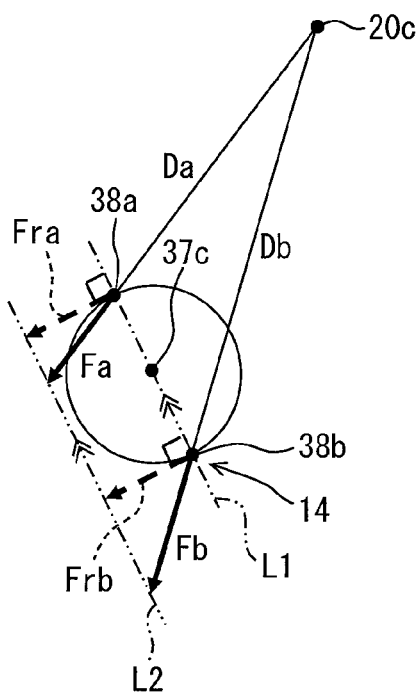
FIG. 6 is a view for explaining an effect of two projections of the first embodiment.

In FIG. 6, the following formula (1) is satisfied, since each of the distances between the base-plate center 20c and the respective contacting points (38a, 38b) is in proportion to the force of the deformation of the base plate 20 at each contacting point (38a, 38b):

$$Da : Fa = Db : Fb \quad (1)$$

In the above formula (1), "Da" is a distance between the base-plate center 20c and the contacting point at the first projection 38a (hereinafter, the first contacting point), "Db" is a distance between the base-plate center 20c and the contacting point at the second projection 38b (hereinafter, the second contacting point), "Fa" is a force generated by the deformation of the base plate 20 and applied to the first contacting point of the first projection 38a when the base plate 20 is expanded, and "Fb" is a force generated by the deformation of the base plate 20 and applied to the second contacting point of the second projection 38b. In FIG. 6, each of the respective forces "Fa" and "Fb" generated by the deformation of the base plate 20 is indicated by an arrow of a solid line (a heavy line).

A virtual line L2 indicated by a two-dot-chain line in FIG. 6 is in parallel to the virtual line L1. The arrow of the heavy solid line, which extends from the first contacting point of the first projection 38a to the virtual line L2 in an extending direction of a line connecting the base-plate center 20c and the first contacting point of the first projection 38a, corresponds to the force "Fa" generated by the deformation of the base plate 20 at the first contacting point. In a similar manner, the arrow of the heavy solid line, which extends from the second contacting point of the second projection 38b to the virtual line L2 in an extending direction of a line connecting the base-plate center 20c and the second contacting point of the second projection 38b, corresponds to the force "Fb" generated by the deformation of the base plate 20 at the second contacting point.

In FIG. 6, "Fra" is a force (hereinafter, a rotative force) for rotating the screw member 13 by a frictional force generated at the first contacting point (38a) when the force "Fa" of the deformation is applied to the screw-fixing portion 14. The rotative force "Fra" is equal to a component of the force "Fa" of the deformation in a tangential direction of a virtual circle passing through the contacting points (38a, 38b).

In a similar manner, "Frb" is a force (a rotative force) for rotating the screw member 13 by a frictional force generated at the second contacting point (38b) when the force "Fb" of the deformation is applied to the screw-fixing portion 14. And the rotative force "Frb" is equal to a component of the force "Fb" of the deformation in a tangential direction of the virtual circle at the second contacting point (38b).

In FIG. 6, each of the rotative forces "Fra" and "Frb" is indicated by an arrow of a heavy dotted line.

As explained above, the projections 38a and 38b are arranged in the symmetric manner with respect to the screw-hole center 37c and the above formula (Da:Fa=Db:Fb) is satisfied. As a result, the rotative forces "Fra" and "Frb" are equal to each other and each of the rotative forces "Fra" and "Frb" has a direction to be applied to the respective contacting points (38a, 38b), which is opposite to each other with respect to the screw-hole center 37c. Accordingly, the rotative force "Fra" applied to the first contacting point (38a) and the rotative force "Frb" applied to the second contacting point (38b) cancel each other, when the base plate 20 is expanded.

Therefore, it is possible to reduce a torque for fastening the screw member 13 so that the base plate 20 can move in its surface direction when it is expanded or contracted. As a result, it becomes possible not only to decrease the stresses to be applied to the soldering portions of the electronic components 21 but also to suppress the possible loosening of the screw members 13.

In a case that the base plate 20 is contracted, each of the directions for the forces "Fa", "Fb", "Fra" and "Frb" is reversed from the case of the expansion. However, the same advantages to those in the case of the expansion can be also obtained in the case of the contraction.

In the present embodiment, each of the projections 38a and 38b has the semi-spherical shape. The shape of the projections is not limited to the semi-spherical shape. For example, the projection may be formed in a conic shape, a pyramid shape or the like. Alternatively, the projection may be formed in a circular cylindrical shape, a tubular shape and so on.

In a case that three contacting points are provided in one screw-fixing portion 14, each of the rotative forces at the respective contacting points does not balance one another (except for a case of a seventh embodiment explained below), when the base plate 20 is expanded or contracted. Then, such a rotative force for loosening the fastening force of the screw member 13 may be generated.

In addition, in a case that the contacting points more than three are provided in one screw-fixing portion, one of or some of the contacting points may not be brought into contact with the base plate 20 because of variation of the configurations for the projections, deformation thereof and so on. In such a case, it becomes difficult to balance the rotative forces among the multiple contacting points and then a force for loosening the fastening force of the screw member may be generated.

In view of the above points, it is preferable to provide two projections 38a and 38b.

In the present embodiment, the projections 38a and 38b are integrally formed with the first casing 30. It may be so modified as to provide a different member to be attached to the first casing 30 and to form the projections on the different member.

Second Embodiment

A second embodiment of the present disclosure will be explained with reference to FIGS. 7 and 8. Explanation for those portions of an electronic device according to the second embodiment, which are the same to those of the first embodiment, will be omitted.

In the present embodiment, two projections 42a and 42b are formed in the screw member 13, so that the screw member 13 is brought into contact with the second board surface 20b of the base plate 20 at two contacting points in each screw-fixing portion 14. As shown in FIGS. 7 and 8, a first projection 42a and a second projection 42b, each of which extends from the screw head 40 in a direction to the base plate 20, are formed on the contact-side surface portion 40a of the screw head 40. The projections 42a and 42b formed in the same screw-fixing portion 14 are arranged in a symmetric manner with respect to a center axis 13c of the screw member 13.

In a condition that the screw shaft 41 is inserted and screwed into the screw hole 37, the center axis 13c of the screw member 13 almost coincides with the screw-hole center 37c. Therefore, the first and the second projections 42a and 42b are also symmetric with respect to the screw-hole center 37c.

In the present embodiment, each of the projections 42a and 42b is formed in a semi-spherical shape of the same configuration to each other. Each of the projections 42a and 42b is in a point-contact with the second board surface 20b of the base plate 20. Each of the projections 42a and 42b is integrally formed with and as a part of the screw member 13.

The first casing 30 does not have a structure corresponding to the projections 38a and 38b of the first embodiment. Instead, a supporting portion 39 is integrally formed in the first casing 30 at a position surrounding the screw hole 37. The supporting portion 39 is projected from an inside surface of the first casing 30 neighboring to and surrounding the screw hole 37 in an inside direction of the housing 12 (in the Z-direction). The supporting portion 39 has an inside flat surface of a circular shape. The first board surface 20a of the base plate 20 is in contact with the supporting portion 39.

Accordingly, the same advantages to those of the first embodiment can be obtained in the second embodiment, even in the case that the projections 42a and 42b are formed on the side of the screw member 13.

Therefore, it is possible to reduce the torque for fastening the screw member 13 so that the base plate 20 can move in its surface direction in a case of the expansion and/or contraction of the base plate 20. As a result, it becomes possible not only to decrease the stresses to be applied to the soldering portions of the electronic components 21 but also to suppress the possible loosening of the screw members 13.

(First Modification)

Figure 9:
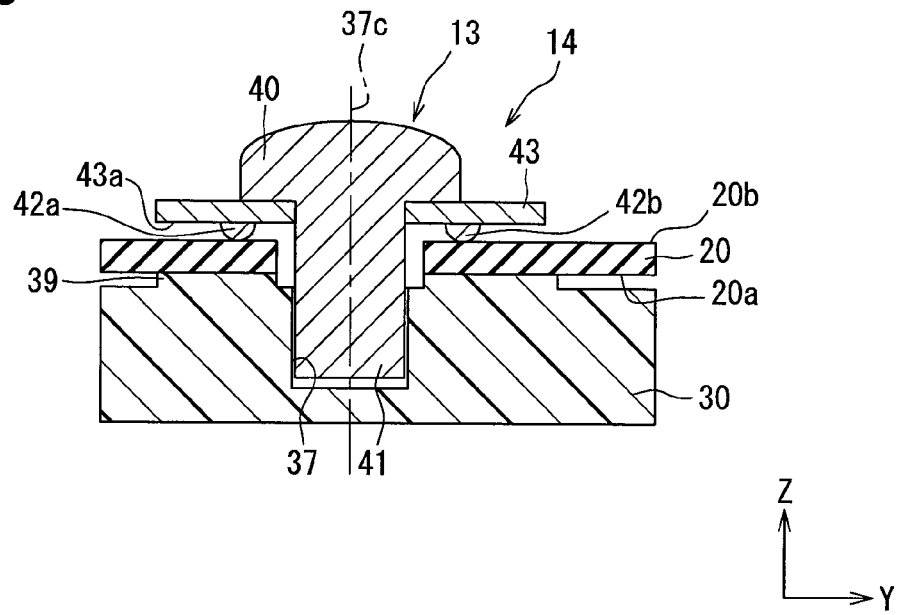
FIG. 9 is a schematic cross sectional view showing a screw-fixing portion, including a screw member and its related members, according to a first modification of the present disclosure.

A screw member having a washer may be also used in the second embodiment. In such a case, the projections 42a and 42b are formed on the washer. As shown in FIG. 9, which shows a modification of the second embodiment, the screw member 13 has a plain washer 43, which is integrally connected to the screw head 40 and/or the screw shaft 41. The projections 42a and 42b are formed on a contact-side surface portion 43a of the plain washer 43, which is opposed to the second board surface 20b of the base plate 20. The plain washer 43 may be formed as an independent member from the screw member 13 (a separate member from the screw head 40 and the screw shaft 41).

(Second Modification)

Figure 10:
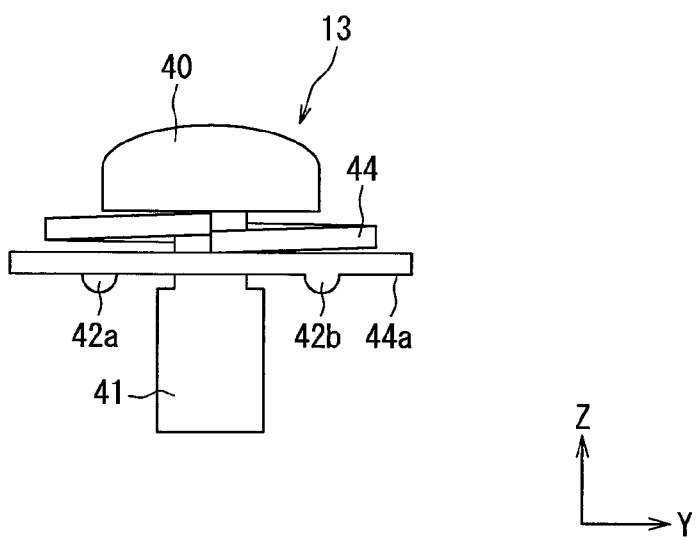
FIG. 10 is a schematic side view showing a screw-fixing portion, including a screw member and its related members, according to a second modification of the present disclosure.

FIG. 10 shows a second modification, wherein the screw member 13 has a spring washer 44. The spring washer 44 is formed as a separate member from the screw head 40 and the screw shaft 41. The projections 42a and 42b are formed on a contact-side surface portion 44a of the spring washer 44, which is opposed to the second board surface 20b of the base plate 20. The projections 42a and 42b are formed on the same flat surface of the contact-side surface portion 44a. In FIG. 10, only the screw member 13 and the washer 44 are illustrated.

Figure 7:
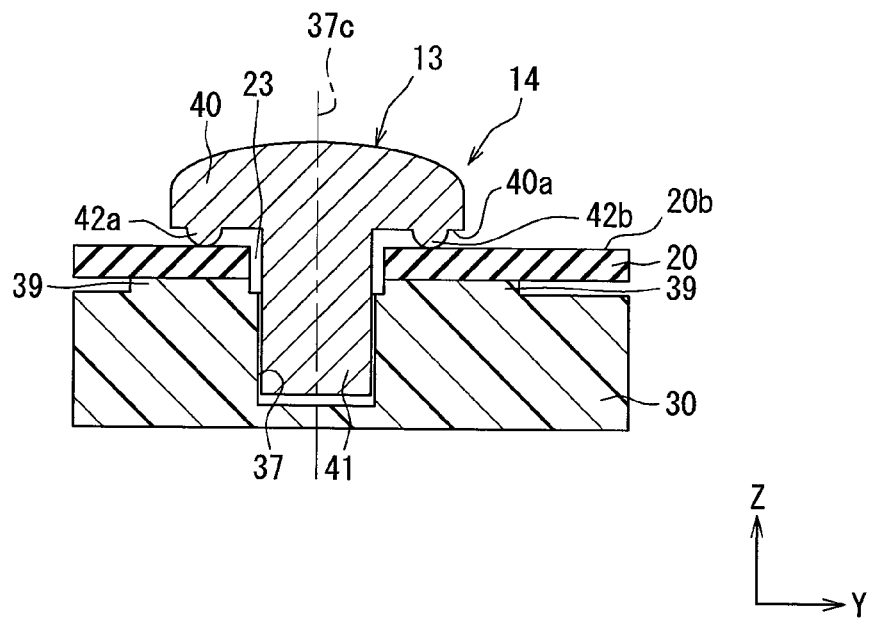
FIG. 7 is a schematic cross sectional view showing a screw-fixing portion, including a screw member and its related members, according to a second embodiment of the present disclosure.
Figure 8:
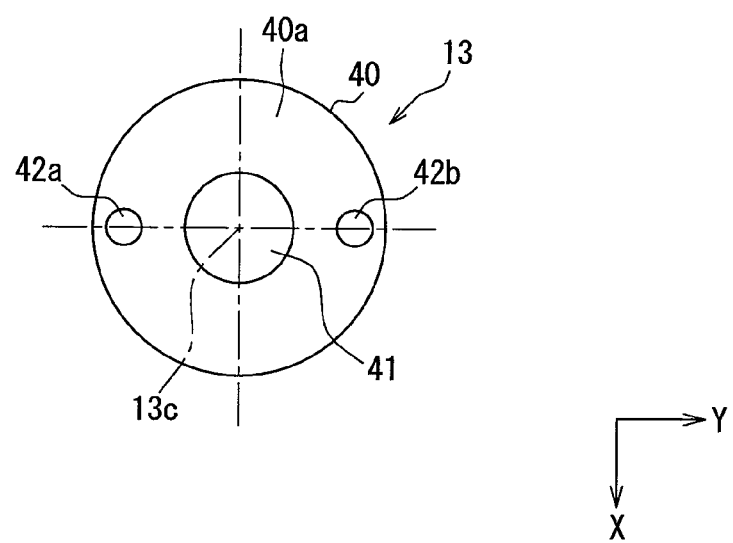
FIG. 8 is a schematic plan view showing the screw member when viewed it from a side of a column portion of the screw member, that is, from a lower side of the screw member in FIG. 7.

In the second embodiment shown in FIG. 7, the projections 42a and 42b are made of the same material to the screw member 13 and integrally formed with the screw member 13 as a part thereof. However, as shown in FIG. 9 or 10, the separate member (for example, the plain washer 43, the spring washer 44) is attached to the screw member 13 and the projections 42a and 42b may be formed on the separate member.

Third Embodiment

A third embodiment of the present disclosure will be explained with reference to FIGS. 11 and 12. Explanation for those portions of an electronic device according to the third embodiment, which are the same to those of the first embodiment, will be omitted.

According to the present embodiment, two projections 24a and 24b are provided on the base plate 20. As shown in FIGS. 11 and 12, a first projection 24a and a second projection 24b are formed on the second board surface 20b of the base plate 20, so that the screw head 40 of the screw member 13 is brought into contact with the second board surface 20b at two positions (two contacting points) in each of the screw-fixing portions 14. The first and the second projections 24a and 24b are arranged in a symmetric manner with respect to a center of the through-hole 23 formed in the base plate 20. The base plate 20 is located in the first casing 30, so that each center of the through-holes 23 almost coincides with the respective screw-hole center 37c. The screw member 13 is inserted through the through-hole 23 and screwed into the screw hole 37. As a result, the projections 24a and 24b are also arranged in the symmetric manner with respect to the screw-hole center 37c.

In the present embodiment, each of the projections 24a and 24b is likewise formed in a semi-spherical shape of the same configuration to each other. Since the first and the second projections 24a and 24b are symmetric with respect to the center of the through-hole 23, a position of the first projection 24a coincides with that of the second projection 24b, when the first projection 24a is rotated by 180 degrees around the screw-hole center 37c. Each of the projections 24a and 24b is in a point-contact with the contact-side surface portion 40a of the screw head 40.

Each of the projections 24a and 24b is composed of a metal layer 25 for forming the printed wiring pattern on the base plate 20 and a solder resist layer 26 formed on the metal layer 25. The projections 24a and 24b may be composed of either one of the metal layer 25 and the solder resist layer 26. A copper foil is used for the metal layer 25. The solder resist layer 26 of each projection 24a and 24b is in contact with the contact-side surface portion 40a of the screw member 13.

A surface portion of the second board surface 20b of the base plate 20 adjacent to and surrounding the screw-fixing portion 14, except for an area of the projections 24a and 24b, is a free surface portion 27 on which neither the metal layer 25 nor the solder resist layer 26 is formed. Each of the projections 24a and 24b is projected from the base plate 20 in the direction to the screw head 40 of the screw member 13. The metal layers 25 and/or the solder resist layers 26 for forming the electric wiring patterns are formed on a surface area of the second board surface 20b of the base plate 20 outside of the free surface portion 27. In FIGS. 11 and 12, only the solder resist layer 26 is illustrated in the surface area outside of the free surface portion 27.

The screw member 13 has the same structure to that of the first embodiment. The projections are formed neither in the screw member 13 nor in the first casing 30 of the housing 12. The supporting portion 39 is formed in the first casing 30 like the second embodiment.

The same advantages to those of the first embodiment can be obtained even in the case that the projections 24a and 24b are formed on the second board surface 20b of the base plate 20. Namely, it is possible to reduce the torque for fastening the screw member 13 so that the base plate 20 can move in its surface direction in the case of the expansion and/or the contraction of the base plate 20. As a result, it becomes possible not only to decrease the stresses to be applied to the soldering portions of the electronic components 21 but also to suppress the possible loosening of the screw members 13.

In the present embodiment, each of the projections 24a and 24b is composed of the metal layer 25 and/or the solder resist layer 26. The metal layer 25 and the solder resist layer 26 are those parts for forming the electric wiring patterns on the base plate 20. Therefore, it is possible to reduce a manufacturing cost in the present embodiment, when compared with a case in which a different member from the metal layer 25 and the solder resist layer 26 is provided on the base plate 20 in order to form the projections 24a and 24b. However, it may be also possible to fix different members, which are made of material different from that of the base plate 20, to the base plate 20 by adhesive material in order to form the projections 24a and 24b.

In the case that the projections 24a and 24b are composed of the metal layer 25 and the solder resist layer 26, the solder resist layer 26 can be also formed in the free surface portion 27. In such a case, the solder resist layer 26 to be formed in the free surface portion 27 may be integrally formed with the solder resist layer 26 to be formed on the second board surface 20b in the surface area outside of the free surface portion 27. In the surface area where the projections 24a and 24b are formed, the metal layer 25 is further located between the solder resist layer 26 and the base plate 20. On the other hand, in the surface area where the solder resist layer 26 is formed outside of the projections 24a and 24b, the metal layer 25 does not exist. In other words, a height of the surface area for the projections 24a and 24b is larger than that of the other surface area in which only the solder resist layer 26 is formed. Therefore, the projections 24a and 24b are preferentially brought into contact with the contact-side surface portion 40a of the screw member 13.

However, in the case that the free surface portion 27 is formed on the second board surface 20b of the base plate 20, a difference in height between the projections 24a and 24b and the free surface portion 27 is larger than that of the case in which the solder resist layer 26 is formed in the surface area of the free surface portion 27. As a result, it is possible to more surely bring the base plate 20 into contact with the contact-side surface portion 40a of the screw member 13 at the two positions of the projections 24a and 24b, in the case that the solder resist layer 26 is not formed in the free surface portion 27.

Each of the projections 24a and 24b may be formed by only the metal layer 25. Alternatively, each of the projections 24a and 24b may be formed by only the solder resist layer 26. It is important for the projections 24a and 24b that each of the projections has the height, which is larger than that of the surface area adjacent to and surrounding the projections 24a and 24b.

(Third Modification)

Figure 11:
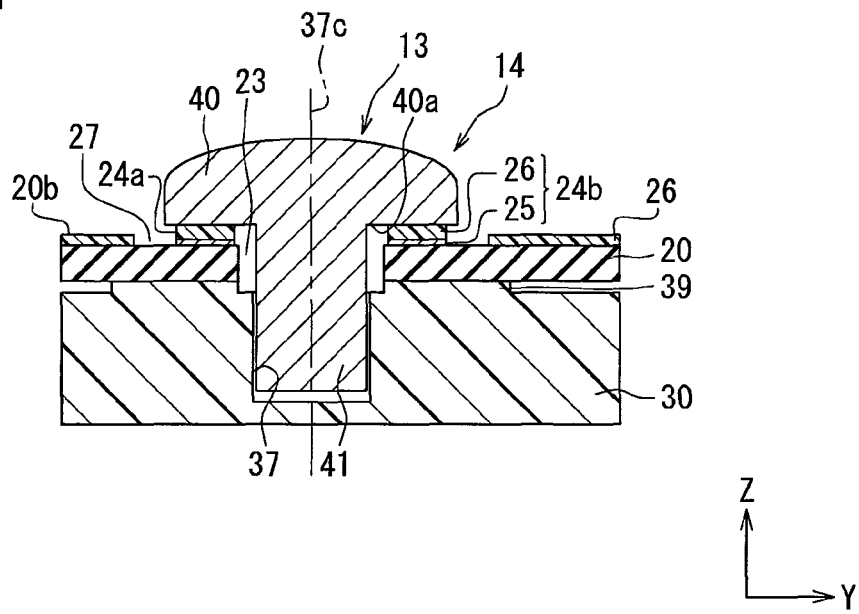
FIG. 11 is a schematic cross sectional view showing a screw-fixing portion, including a screw member and its related members, according to a third embodiment of the present disclosure.
Figure 12:
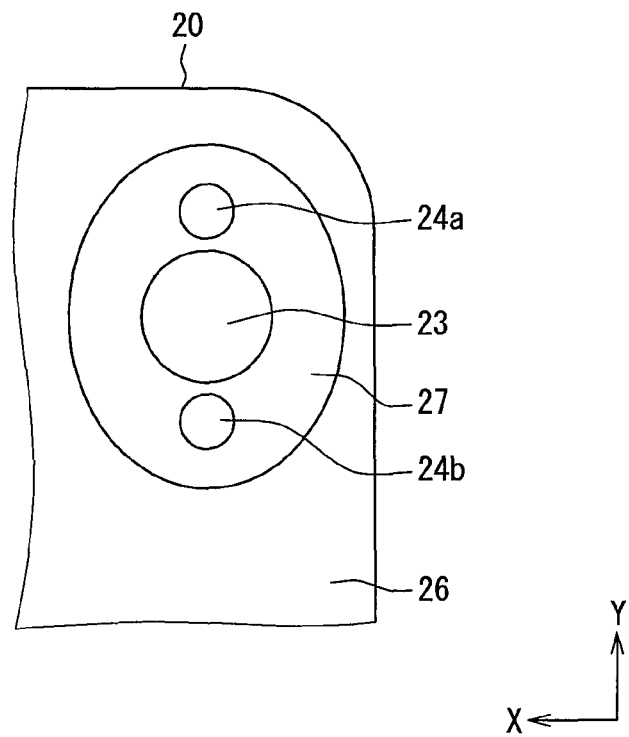
FIG. 12 is a schematic plan view showing a part of a base plate of a circuit board assembly, including a through-hole formed in the base plate and its neighboring portions.
Figure 13:
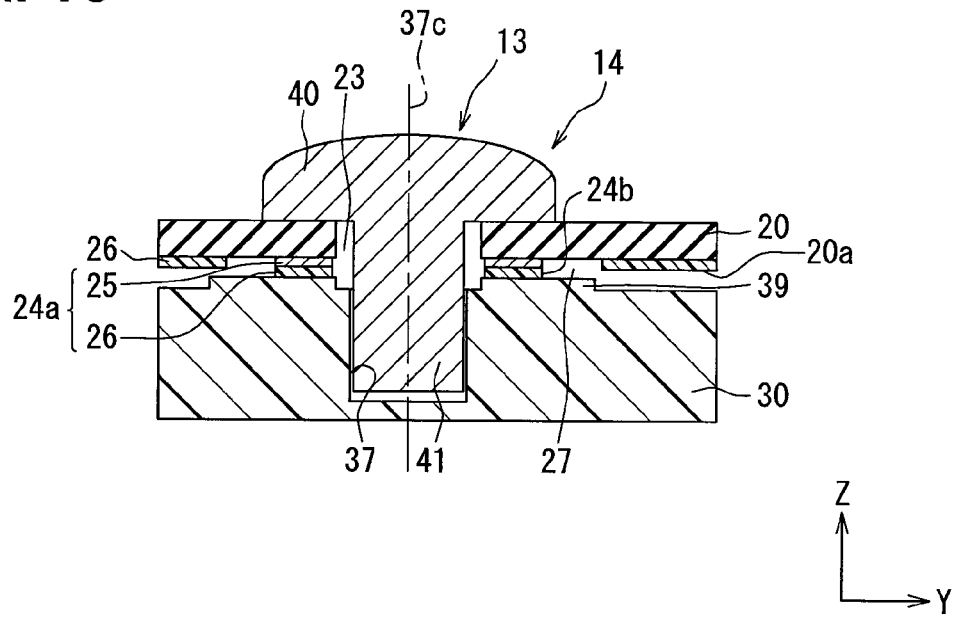
FIG. 13 is a schematic cross sectional view showing a screw-fixing portion, including a screw member and its related members, according to a third modification of the present disclosure.

In the third embodiment shown in FIGS. 11 and 12, the projections 24a and 24b are formed on the second board surface 20b of the base plate 20. However, the projections 24a and 24b may be formed on the first board surface 20a of the base plate 20, as shown in FIG. 13 (a third modification of the present disclosure). In this case, the base plate 20 is brought into contact with the first casing 30 of the housing 12 at two positions of the projections 24a and 24b.

Fourth Embodiment

A fourth embodiment of the present disclosure will be explained with reference to FIG. 14. Explanation for those portions of an electronic device according to the fourth embodiment, which are the same to those of the first embodiment, will be omitted.

According to the present embodiment, two projections 38a and 38b are formed in the first casing 30 of the housing 12 in each of the screw-fixing portions 14, like the first embodiment, wherein each of the projections 38a and 38b is elongated in a direction different from a line (not shown) connecting each center of the projections 38a and 38b with each other on the X-Y plane. The line connecting the centers of the projections 38a and 38b is referred to as an alignment direction of the projections 38a and 38b, that is, the y-direction in the present embodiment shown in FIG. 14. Each of the projections 38a and 38b is in a surface-contact with the first board surface 20a of the base plate 20. The projections 38a and 38b are arranged in the symmetric manner with respect to the screw-hole center 37c. Each of the projections 38a and 38b is elongated along an outer periphery of the screw hole 37. Therefore, each of the projections 38a and 38b is formed in an arc shape on the X-Y plane and has a predetermined width in a radial direction from the screw-hole center 37c. As shown in FIG. 14, each of the projections 38a and 38b has a fan-shaped top surface portion, which is surrounded by two arc lines and two side lines. Each of the side lines connects the two arc lines with each other in the radial direction extending from the screw-hole center 37c. Accordingly, each of the projections 38a and 38b (more exactly, each fan-shaped top surface) is in the surface-contact with the first board surface 20a of the base plate 20.

In the structure, in which the two projections 38a and 38b are in the point-contact with the opposing element (for example, the base plate 20), the base plate 20 and/or the screw member 13 may be possibly inclined in the X-direction, which is perpendicular to the Y-direction (the alignment direction of the projections 38a and 38b), when the screw member 13 is screwed into the screw hole 37 of the first casing 30 of the housing 12.

According to the present embodiment, however, each of the projections 38a and 38b is elongated along the outer periphery of the screw hole 37. In other words, each of the projections 38a and 38b extends in a direction (the X-direction) almost perpendicular to the alignment direction (the Y-direction) of the projections. Therefore, it is possible to prevent the inclination of the screw member 13 during a fastening step of the screw member 13.

Figure 14:
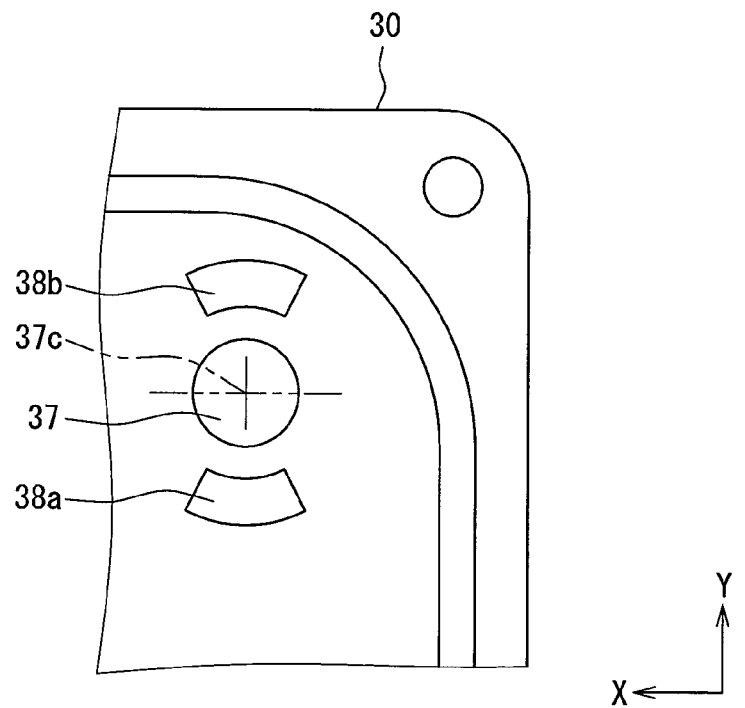
FIG. 14 is a schematic plan view showing a part of an upper-side casing of an electronic device, including a screw hole and its neighboring portions, according to a fourth embodiment of the present disclosure.

The direction for elongating the projections 38a and 38b is not limited to the example shown in FIG. 14. The projection may be elongated not only in the X-direction but also in any other directions different from the Y-direction (that is, a direction not perpendicular to the alignment direction of the projections 38a and 38b). In addition, the shape of the projection 38a, 38b may be changed, for example, from the arc shape to a rectangular shape, which is elongated in the X-direction.

(Fourth & Fifth Modifications)

Figure 15:
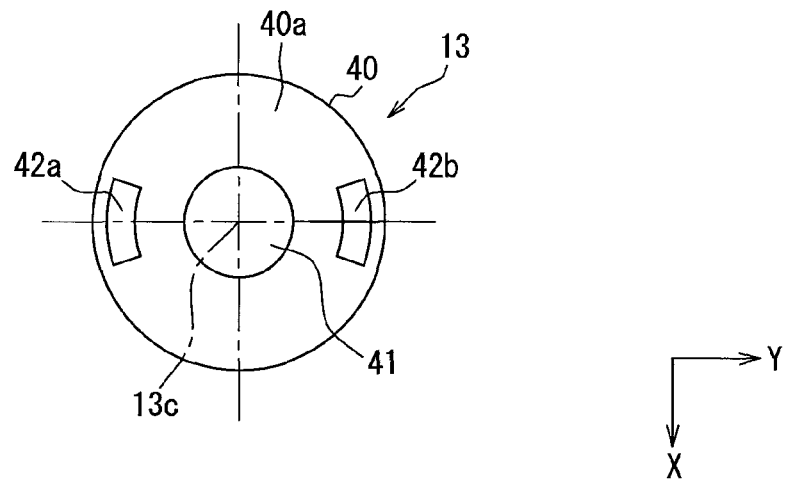
FIG. 15 is a schematic plan view showing a screw member when viewed it from a side of a column portion of the screw member, that is, from a lower side thereof, according to a fourth modification of the present disclosure.

FIG. 15 shows a modification of the fourth embodiment shown in FIG. 14. The modification of FIG. 15 corresponds to a fourth modification of the present disclosure. In the fourth modification of FIG. 15, arc-shaped projections 42a and 42b are formed on the contact-side surface portion 40a of the screw head 40.

Figure 16:
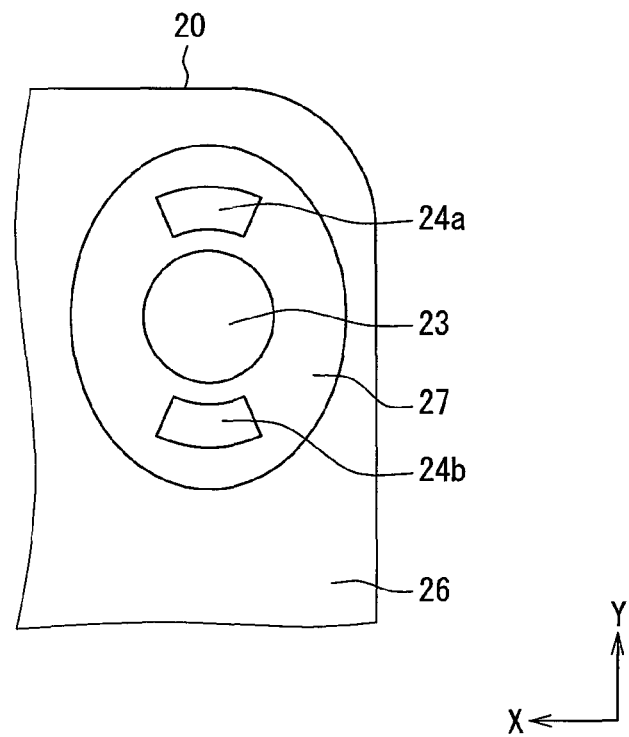
FIG. 16 is a schematic plan view showing a part of a base plate of a circuit board assembly, including a through-hole formed in the base plate and its neighboring portions, according to a fifth modification of the present disclosure.

In a similar manner to the fourth modification of FIG. 15, arc-shaped projections 24a and 24b may be formed on the first and/or the second board surfaces 20a and 20b of the base plate 20. In FIG. 16, which corresponds to a fifth modification of the present disclosure, the arc-shaped projections 24a and 24b are formed on the second board surface 20b of the base plate 20.

As shown in FIGS. 15 and 16, each of the projections 42a, 42b and 24a, 24b is formed in the arc shape having a flat top surface, so that the surface contact is realized between the screw member 13 and the base plate 20 or between the base plate 20 and the first casing 30 of the housing 12.

Fifth Embodiment

A fifth embodiment of the present disclosure will be explained with reference to FIGS. 17 and 18. Explanation for those portions of an electronic device according to the fifth embodiment, which are the same to those of the third embodiment (FIGS. 11 and 12), will be omitted.

In the same manner to the third embodiment, the base plate 20 of the present embodiment has two projections 24a and 24b in each of the screw-fixing portions 14. Each of the projections 24a and 24b of a semi-spherical shape is formed on the second board surface 20b of the base plate 20, so that each of the projections 24a and 24b is brought into the point-contact with the contact-side surface portion 40a of the screw head 40.

Figure 17:
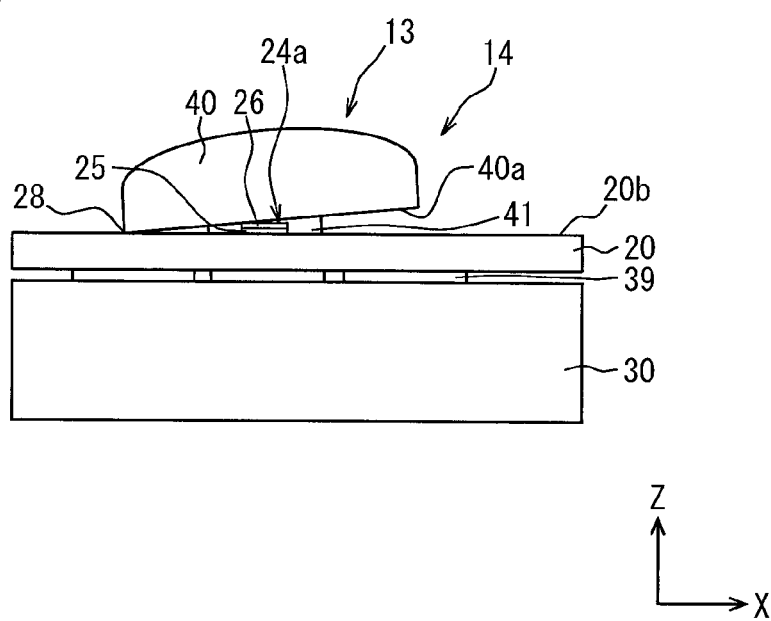
FIG. 17 is a schematic side view showing a screw member, which is inclined with respect to a base plate of a circuit board assembly.

In the structure, in which the two projections 24a and 24b are in the point-contact with the opposing element (for example, the screw member 13) and the projections 24a and 24b are symmetrically arranged with respect to the screw-hole center 37c, the screw member 13 may be possibly inclined, as shown in FIG. 17, when the screw member 13 is screwed into the screw hole of the first casing 30 of the housing 12. More exactly, the screw member 13 may be inclined in the X-direction, which is perpendicular to the Y-direction (the alignment direction of the projections 24a and 24b).

In FIG. 17, the metal layer 25 and the solder resist layer 26 are omitted in the surface area other than the screw-fixing portion 14 for the sake of simplification. A reference numeral 28 designates an additional contacting point, at which the screw head 40 of the screw member 13 is brought into contact with the base plate 20 in a case of the inclination of the screw member 13.

According to the present embodiment, each of the projections 24a and 24b is located at such a position, a distance of which from the base-plate center 20c is equal to each other. As shown in FIG. 18, a distance "Da" and a distance "Db" are substantially equal to each other.

The additional contacting point 28 between the screw member 13 and the base plate 20 is located on a virtual line L3, which passes over the base-plate center 20c and the screw-hole center 37c. In the present embodiment, a contacting point between the first projection 24a and the base plate 20 is a first contacting point, while a contacting point between the second projection 24b and the base plate 20 is a second contacting point. FIG. 18 shows a condition that the base plate 20 is expanded.

In the present embodiment, the formula (1) of "Da:Fa=Db:Fb" is also satisfied. Therefore, the rotative force "Fra" generated at the first contacting point (24a) and the rotative force "Frb" generated at the second contacting point (24b) are equal to each other in different directions (in the opposite directions) around the screw-hole center 37c. As a result, even when the base plate 20 is expanded, the rotative force "Fra" generated at the first contacting point of the first projection 24a and the rotative force "Frb" generated at the second contacting point of the second projection 24b cancel each other.

Figure 18:
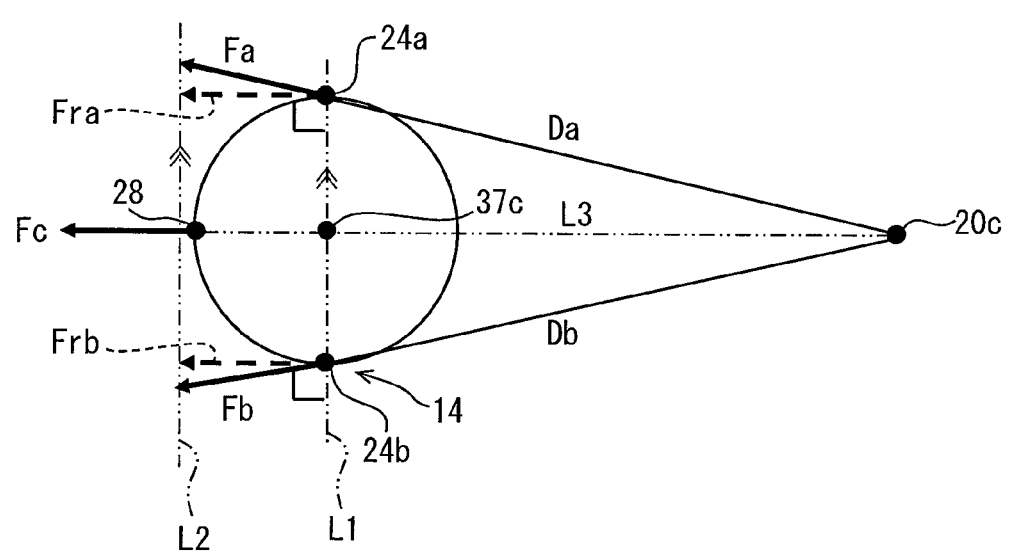
FIG. 18 is a view for explaining an effect of two projections according to a fifth embodiment of the present disclosure.

Since the additional contacting point 28 is located on the virtual line L3, a force "Fc" which is generated by the expansion of the base plate 20 and applied to the additional contacting point 28 is directed in a direction along the virtual line L3 and away from the base-plate center 20c, as indicated by an arrow of a solid line in FIG. 18. The force "Fc" generated by the expansion of the base plate 20 is perpendicular to a rotating direction of the screw member 13 at the additional contacting point 28. Accordingly, the force "Fc" generated at the additional contacting point 28 does not generate a rotating force for loosening the screw member 13.

Accordingly, it is possible to reduce the torque for fastening the screw member 13 so that the base plate 20 can move in its surface direction in the case of the expansion and/or the contraction of the base plate 20. Therefore, it becomes possible not only to decrease the stresses to be applied to the soldering portions of the electronic components 21 but also to suppress the possible loosening of the screw members 13. The same advantages can be also obtained when the base plate 20 is contracted.

In the present embodiment, the additional contacting point 28 is located at the point, which is more remote from the base-plate center 20c than the screw-hole center 37c. However, the additional point 28 may be located on the virtual line L3 but closer to the base-plate center 20c than the screw-hole center 37c. Even in such a case, the same advantages can be obtained.

In the present embodiment, the projections 24a and 24b are formed on the second board surface 20b of the base plate 20. However, the projections (38a and 38b) may be formed on the first casing 30 of the housing 12. The same advantages can be obtained, when the distance between the first contacting point (at the first projection 38a formed on the first casing 30) and the base-plate center 20c and the distance between the second contacting point (at the second projection 38b formed on the first casing 30) and the base-plate center 20c are made equal to each other.

In addition, the same advantages can be obtained when the projections (42a and 42b) are formed on the contact-side surface portion 40a of the screw member 13 in such a way that the distance between the first contacting point (the first projection 42a) and the base-plate center 20c and the distance between the second contacting point (the second projection 42b) and the base-plate center 20c are substantially equal to each other.

In this case, however, it is necessary to screw and rotate the screw member 13 in such a way that the above distances between the first and the second contacting points (the projections 42a and 42b) and the base-plate center 20c become equal to each other. Accordingly, it is more preferable to form the projections 24a and 24b on the base plate 20 or to form the projections (38a and 38b) on the first casing 30 of the housing 12, in order that the distances between the respective projections and the base-plate center are made equal to each other.

Sixth Embodiment

A sixth embodiment of the present disclosure will be explained with reference to FIGS. 19 and 20. Explanation for those portions of an electronic device according to the sixth embodiment, which are the same to those of the first embodiment, will be omitted.

The electronic device 10 of the present embodiment has the circuit board assembly 11 including the base plate 20, the housing 12, the screw members 13 and so on. Multiple screw-fixing portions 14 are formed by the screw members 13, the base plate 20 and the housing 12. In each of the screw-fixing portions 14, two projections are provided in one of the screw member 13, the base plate 20 and the housing 12, so that the screw member 13 and the base plate 20 or the base plate 20 and the housing 12 are brought into contact with each other at two positions corresponding to the projections. Accordingly, the basic structure of the present embodiment is substantially the same to that of the first embodiment. However, the present embodiment is different from the first embodiment in that the two projections are not located on a diametrical direction of the screw-hole center 37c but located at such positions that a distance between the first projection and the base-plate center 20c and a distance between the second projection and the base-plate center 20c are equal to each other. Therefore, the two projections are not arranged in a symmetric manner with respect to the screw-hole center 37c, but located at such positions which are symmetric with respect to the line (the virtual line "L3") connecting the base-plate center 20c to the screw-hole center 37c.

Figure 19:
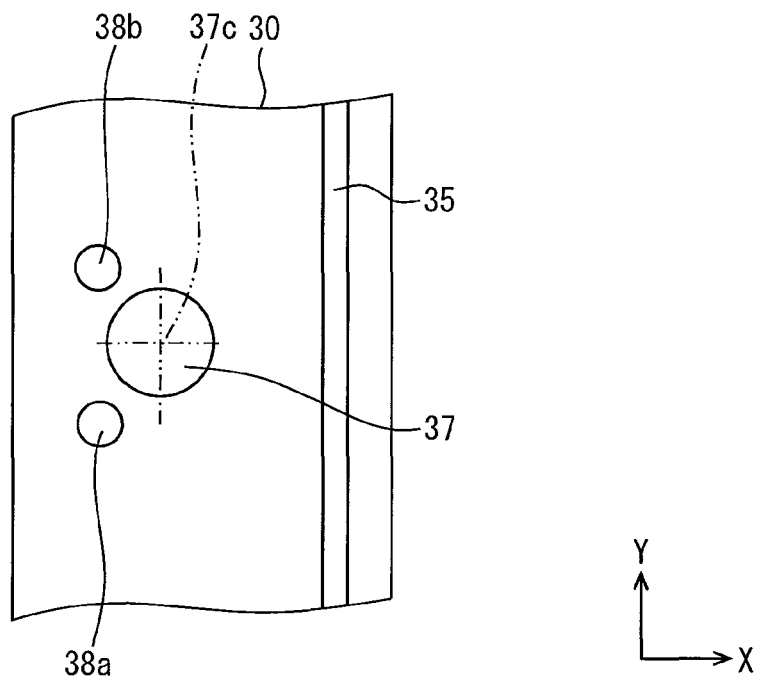
FIG. 19 is a schematic plan view showing a part of an upper-side casing of an electronic device, including a screw hole and its neighboring portions, according to a sixth embodiment of the present disclosure.

As shown in FIG. 19, two projections 38a and 38b are formed in the first casing 30 of the housing 12. The projections 38a and 38b do not satisfy the relationship of the symmetric arrangement with respect to the screw-hole center 37c. However, each distance between the projection 38a or 38b and the screw-hole center 37c is equal to each other. As shown in FIG. 20, the distance "Da" between the first contacting point at the first projection 38a and the base-plate center 20c and the distance "Db" between the second contacting point at the second projection 38b and the base-plate center 20c are equal to each other. As a result, the force "Fa" generated by deformation of the base plate 20 and applied to the first contacting point and the force "Fb" generated by the deformation of the base plate 20 and applied to the second contacting point are also equal to each other, although directions of the forces "Fa" and "Fb" are different from each other.

Figure 20:
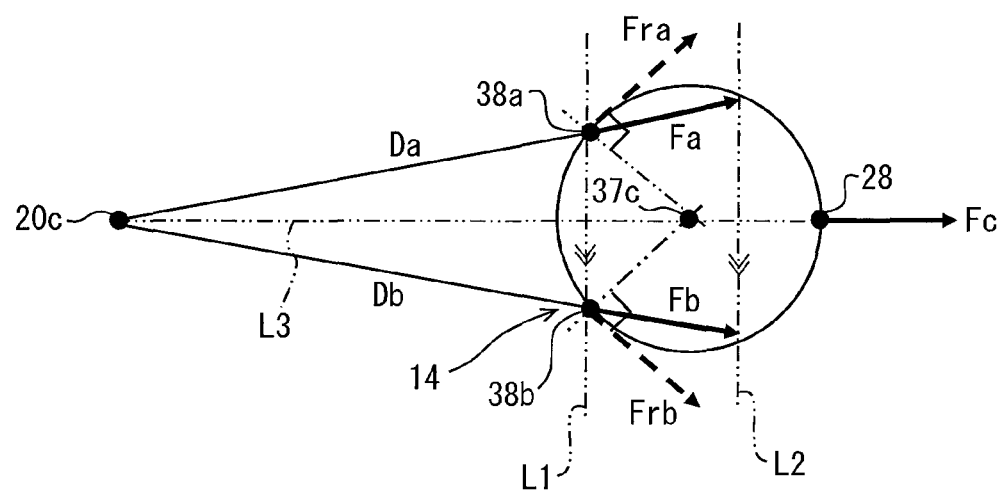
FIG. 20 is a view for explaining an effect of two projections of the sixth embodiment.

In FIG. 20, the virtual line "L1" connecting the contacting points of the two projections 38a and 38b is in parallel to the virtual line "L2". A distance from the first contacting point (38a) to a first intersection point corresponds to the force "Fa" generated by the deformation of the base plate 20. The first intersection point is an intersection point between a line connecting the base-plate center 20c and the first contacting point (38a) and the virtual line "L2". In the same manner, a distance from the second contacting point (38b) to a second intersection point corresponds to the force "Fb" generated by the deformation of the base plate 20. The second intersection point is an intersection point between a line connecting the base-plate center 20c and the second contacting point (38b) and the virtual line "L2".

A rotative force "Fra" generated at the first contacting point (38a) by the force "Fa", which is generated by the deformation of the base plate 20 and applied to the screw member 13, is equal to a component of the force "Fa" in a tangential direction at the first contacting point (38a). In the same manner, a rotative force "Frb" generated at the second contacting point (38b) by the force "Fb", which is generated by the deformation of the base plate 20 and applied to the screw member 13, is equal to a component of the force "Fb" in a tangential direction at the second contacting point (38b). Since the force "Fa" is equal to the force "Fb" (Fa=Fb), the rotative force "Fra" is equal to the rotative force "Frb" (Fra=Frb). In addition, since the distance "Da" is equal to the distance "Db", the first projection 38a and the second projection 38b are symmetric to each other with respect to the virtual line "L3", which passes over the base-plate center 20c and the screw-hole center 37c.

As a result, even when the base plate 20 is expanded, the rotative force "Fra" generated at the first contacting point of the first projection 38a and the rotative force "Frb" generated at the second contacting point of the second projection 38b cancel each other. Therefore, it is possible to reduce the torque for fastening the screw member 13 so that the base plate 20 can move in its surface direction in the case of the expansion thereof. It becomes possible not only to decrease the stresses to be applied to the soldering portions of the electronic components 21 but also to prevent the possible loosening of the screw members 13. The same advantages can be obtained even when the base plate 20 is contracted.

The positions of the projections 38a and 38b are not limited to any specific positions, so long as each of the distances of the contacting points to the base-plate center 20c is equal to each other. For example, in the case that the projections 38a and 38b are symmetrically arranged with respect to the screw-hole center 37c, the positions of the projections 38a and 38b are the same to those of the fifth embodiment shown in FIG. 18. In addition, the projections 38a and 38b may be located at such positions, which are more remote from the base-plate center 20c than the screw-hole center 37c in the X-direction.

In the structure of the present embodiment shown in FIGS. 19 and 20, the screw member 13 may be possibly inclined in the X-direction, which is perpendicular to the Y-direction (the alignment direction of the two projections 38a and 38b), when the screw member 13 is screwed into the screw hole 37 of the first casing 30 of the housing 12. When the screw member 13 is inclined and brought into contact with the base plate 20 at an additional contacting point 28, the additional contacting point 28 is located on the virtual line "L3". The force "Fc" which is generated by the deformation of the base plate 20 and applied to the additional contacting point 28 is directed in a direction along the virtual line "L3" and away from the base-plate center 20c, as indicated by an arrow of a solid line in FIG. 20. A rotative force is not generated at the additional contacting point 28. Accordingly, even when the screw member 13 is brought into contact with the base plate 20 at the additional contacting point 28 because of the inclination of the screw member 13, it is possible to prevent the loosening of the screw member 13.

In the present embodiment, the additional contacting point 28 is located at the position on the virtual line "L3", which is more remote from the base-plate center 20c than the screw-hole center 37c. The additional contacting point 28 may be located at such a position on the virtual line "L3", which is closer to the base-plate center 20c than the screw-hole center 37c, depending on the positions of the projections 38a and 38b with respect to the base-plate center 20c. The same advantages can be also obtained even in such a case.

The projections 24a and 24b may be alternatively formed on the second board surface 20b of the base plate 20. In such a case, the same advantages can be also obtained when the distance from the first projection 24a to the base-plate center 20c and the distance from the second projection 24b to the base-plate center 20c are equal to each other. The projections 42a and 42b may be further alternatively formed on the contact-side surface portion 40a of the screw head 40. Even in such a case, the same advantages can be obtained when the distance from the first projection 42a to the base-plate center 20c and the distance from the second projection 42b to the base-plate center 20c are made equal to each other. In such a case, however, it is necessary to screw and rotate the screw member 13 with respect to the base plate 20 so as to locate the projections 42a and 42b at such positions that each of the distances between the projections 42a and 42b and the base-plate center 20c becomes equal to each other.

Seventh Embodiment

A seventh embodiment of the present disclosure will be explained with reference to FIGS. 21 and 22. Explanation for those portions of an electronic device according to the seventh embodiment, which are the same to those of the sixth embodiment, will be omitted.

The electronic device of the present embodiment also has multiple screw-fixing portions 14. In each of the screw-fixing portions 14, three projections are provided on one of the base plate 20, the housing 12 and the screw member 13, so that the base plate 20 and the screw member 13, or the base plate 20 and the housing 12, are brought into contact with each other at three contacting points. The first and the second projections are located at such positions, that each of the distances between the projections and the base-plate center 20c is equal to each other. And a remaining projection 38c (the third projection) is located at such a position, which is on the virtual line "L3" connecting the base-plate center 20*c* and the screw-hole center 37*c*.

According to the present embodiment, the electronic device has the structure corresponding to the structure of the sixth embodiment of FIG. 20 to which the third projection 38*c* located on the virtual line "L3" is added. In other words, the electronic device of the present embodiment has the third projection 38*c* at a position corresponding to the additional contacting point 28 of the sixth embodiment of FIG. 20.

Figure 21:
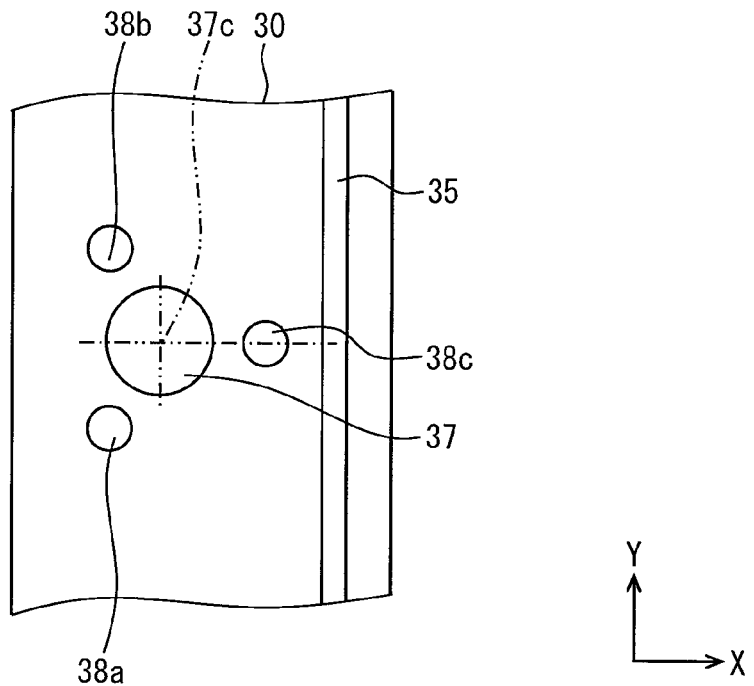
FIG. 21 is a schematic plan view showing a part of an upper-side casing of an electronic device, including a screw hole and its neighboring portions, according to a seventh embodiment of the present disclosure.

In the example shown in FIG. 21 of the present embodiment, the first projection 38*a*, the second projection 38*b* and the third projection 38*c* are formed in the first casing 30 of the housing 12. The third projection 38*c* is also in contact with the first board surface 20*a* of the base plate 20. The first and the second projections 38*a* and 38*b* are not symmetrically located with respect to the screw-hole center 37*c*. However, as shown in FIG. 22, the projections 38*a* and 38*b* are symmetrically arranged with respect to the virtual line L3 (parallel to the X-direction), so that the distance "Da" between the first contacting point (the first projection 38*a*) and the base-plate center 20*c* and the distance "Db" between the second contacting point (the second projection 38*b*) and the base-plate center 20*c* are equal to each other. Each of the projections 38*a* and 38*b* is located at such a position, which is closer to the base-plate center 20*c* than the screw-hole center 37*c*. The third projection 38*c* is located on the virtual line "L3" and at a position more remote from the base-plate center 20*c* than the screw-hole center 37*c*.

In the same manner to the sixth embodiment, since the distance "Da" is equal to the distance "Db", the force "Fa" generated by deformation of the base plate 20 (for example, the expansion of the base plate 20) and applied to the first contacting point and the force "Fb" generated by the deformation of the base plate 20 and applied to the second contacting point are also equal to each other, although the directions of the forces "Fa" and "Fb" are different from each other. Since the force "Fa" is equal to the force "Fb" (Fa=Fb), the rotative force "Fra" generated at the first contacting point is equal to the rotative force "Frb" generated at the second contacting point (Fra=Frb). In other words, since the first and the second projections 38*a* and 38*b* are symmetric with respect to the virtual line "L3", the rotative force "Fra" generated at the first contacting point of the first projection 38*a* and the rotative force "Frb" generated at the second contacting point of the second projection 38*b* cancel each other.

Figure 22:
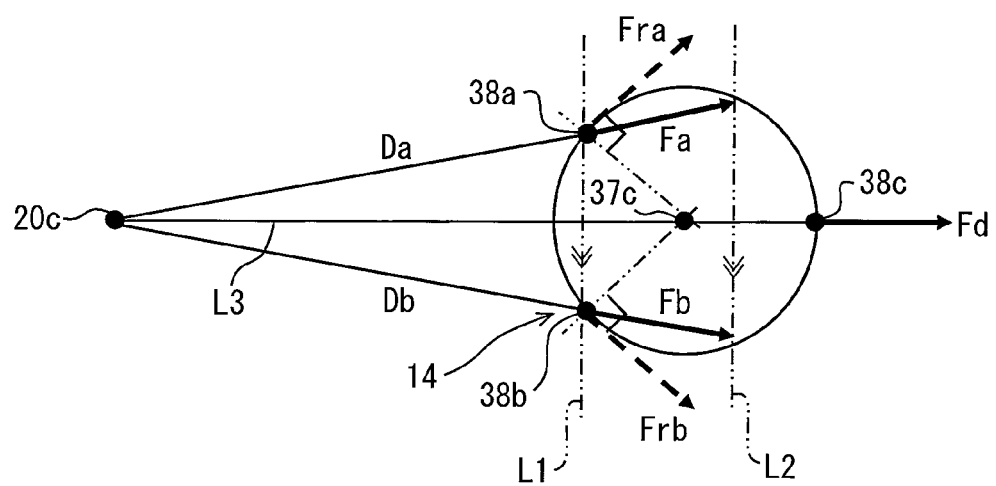
FIG. 22 is a view for explaining an effect of three projections of the seventh embodiment.

Since the third projection 38*c* is located on the virtual line "L3", a force "Fd" which is generated by the expansion of the base plate 20 and applied to the third contacting point (the third projection 38*c*) is directed in the direction along the virtual line "L3" and away from the base-plate center 20*c*, as indicated by an arrow of a solid line in FIG. 22. Therefore, the force "Fd" generated at the third contacting point (38*c*) does not generate a rotating force for loosening the screw member 13.

As above, it is possible to reduce the torque for fastening the screw member 13 in order that the base plate 20 can move in its surface direction in the case of the expansion of the base plate 20. It becomes possible not only to decrease the stresses to be applied to the soldering portions of the electronic components 21 but also to suppress the possible loosening of the screw members 13. The same advantages can be obtained even when the base plate 20 is contracted.

The positions of the three projections 38*a*, 38*b* and 38*c* are not limited to the locations shown in FIGS. 21 and 22. The first and the second projections 38*a* and 38*b* may be located at any other positions, so long as each of the distances of the contacting points to the base-plate center 20*c* is equal to each other. The third projection 38*c* may be located at any other position, so long as it is on the virtual line "L3". In addition, the first and the second projections 38*a* and 38*b* may be located at the positions, which are symmetric with respect to the screw-hole center 37*c*.

In the present embodiment, the first and the second projections 38*a* and 38*b* are located at the positions closer to the base-plate center 20*c* than the screw-hole center 37*c*, while the third projection 38*c* is located at the position more remote from the base-plate center 20*c* than the screw-hole center 37*c*. As a result, it is possible to prevent the screw member 13 from being inclined with respect to the base plate 20 when the screw member 13 is inserted into and screwed into the housing 12.

The same advantages can be also obtained even in a case, in which the first and the second projections 38*a* and 38*b* are located at such positions more remote from the base-plate center 20*c*, while the third projection 38*c* is located at a position closer to the base-plate center 20*c*. Furthermore, it is also possible to locate all of the first to the third projections 38*a* to 38*c* at such positions, which are either closer to, or more remote from, the base-plate center 20*c* than the screw-hole center 37*c*.

It is also possible to locate three projections in each of the screw-fixing portions 14 not on the first casing 30 of the housing 12 like FIG. 21 but on the base plate 20, so long as the locational relationships for the projections are satisfied in the same manner to the projections 38*a* to 38*c*. It is also possible to form the three projections on the contact-side surface portion 40*a* of the screw head 40 so as to satisfy the above locational relationships. However, in the case of the projections formed on the contact-side surface portion 40*a* of the screw head 40, it is necessary to screw and to rotate the screw member 13 in order that the positions of the three projections satisfy the above locational relationships. In view of this point, it is more preferable to form the three projections on the base plate 20 or in the housing 12 (the first casing 30).

The multiple embodiments and/or modifications are explained as above. However, the present disclosure is not limited to those embodiments and/or modifications, but can be further modified in various manners without departing from the spirit of the present disclosure.

In the above embodiments, the electronic device 10 is applied to the engine ECU. The present disclosure may be applied to any other types of the electronic device, which has the base plate 20 (the circuit board assembly 11) to which the electronic component 21 is soldered, the housing 12 and the screw members 13.

The electronic device of the above embodiments has the water-proof structure. The present disclosure may be applied to such an electronic device having no water-proof structure. In such a case, the screw hole 37 may be formed in the housing 12 as a through-hole and a forward end of the screw member 13 (for example, a bolt) may pass through and outwardly project from the housing, and a nut is fastened to the forward end of the screw member so that the screw member 13 is fixed to the housing 12 at its outer peripheral portion.

What is claimed is:
1. An electronic device comprising:
   a base plate, which has multiple through-holes and to which multiple electronic components are soldered;
   a housing having multiple screw holes and accommodating the base plate; and multiple screw members, each of which is inserted through each of the through-holes of the base plate and screwed into each of the screw holes of the housing for fixing the base plate to the housing, wherein:

the electronic device has multiple screw-fixing portions, at each of which the base plate is respectively fixed to the housing by the screw member, in each of the screw-fixing portions, two projections are formed at one of the base plate and the housing, the two projections are separately formed from each other in order that the screw member and the base plate, or the base plate and the housing, are in contact with each other at two contacting points respectively formed by the two projections, in each of the screw-fixing portions, the two projections are located at such positions, which are symmetric with respect to a screw-hole center of the screw hole, and the two projections in each of the screw-fixing portions are located at such positions, which are symmetric with respect to a line connecting a base-plate center and the screw-hole center.

2. The electronic device according to claim 1, wherein the two projections are located on an alignment line passing over the screw-hole center, in each of the screw-fixing portions, each of the two projections is elongated on a plane of a surface, on which the projections are formed, in a direction different from the alignment line of the projections, and each of the two projections is in a surface-contact with an opposing member, which is composed of the screw member, the base plate or the housing.

3. The electronic device according to claim 1, wherein each of the two projections is made of a metal layer and/or a solder resist layer, and the metal layer is made of material, which is the same to that for electric wiring patterns formed on the base plate.

4. The electronic device according to claim 1, wherein the number of the projections is solely two, and each of the two projections does not enter the base plate, or the housing, or the screw member, depending on where the projections are formed.

5. An electronic device comprising:

a base plate, which has multiple through-holes and to which multiple electronic components are soldered;

a housing having multiple screw holes and accommodating the base plate; and multiple screw members, each of which is inserted through each of the through-holes of the base plate and screwed into each of the screw holes of the housing for fixing the base plate to the housing, wherein:

the electronic device has multiple screw-fixing portions, at each of which the base plate is respectively fixed to the housing by the screw member, in each of the screw-fixing portions, a first and a second projections are formed at one of the base plate and the housing, the first and the second projections are separately formed from each other in order that the screw member and the base plate, or the base plate and the housing, are in contact with each other at two contacting points respectively formed by the first and the second projections, and in each of the screw-fixing portions, the first and second projections are located at such positions, which are symmetric with respect to a line connecting a base-plate center of the base plate and a screw-hole center of the screw hole, so that a first distance between the first projection and the base-plate center and a second distance between the second projection and the base-plate center are equal to each other.

6. The electronic device according to claim 5, wherein the number of the projections is solely two, and each of the two projections does not enter the base plate, or the housing or the screw member, depending on where the projections are formed.

7. An electronic device comprising:

a base plate, which has multiple through-holes and to which multiple electronic components are soldered;

a housing having multiple screw holes and accommodating the base plate; and multiple screw members, each of which is inserted through each of the through-holes of the base plate and screwed into each of the screw holes of the housing for fixing the base plate to the housing, wherein:

the electronic device has multiple screw-fixing portions, at each of which the base plate is respectively fixed to the housing by the screw member, in each of the screw-fixing portions, a first, a second and a third projections are formed at one of the base plate and the housing, the first, the second, and the third projections are separately formed from one another in order that the screw member and the base plate, or the base plate and the housing, are in contact with each other at three contacting points respectively formed by the first to the third projections, and in each of the screw-fixing portions, the first and the second projections are located at such positions, which are symmetric with respect to a line connecting a base-plate center of the base plate and a screw-hole center of the screw hole, and the third projection in the same screw-fixing portion is located at such a position on the line connecting the base-plate center and the screw-hole center.

8. The electronic device according to claim 7, wherein the number of the projections is solely three, and each of the three projections does not enter the base plate or the housing or the screw member, depending on where the projections are formed.

9. An electronic device comprising:

a base plate, which has multiple through-holes and to which multiple electronic components are soldered;

a housing having multiple screw holes and accommodating the base plate; and multiple screw members, each of which is inserted through each of the through-holes of the base plate and screwed into each of the screw holes of the housing for fixing the base plate to the housing, wherein:

the electronic device has multiple screw-fixing portions, at each of which the base plate is respectively fixed to the housing by the screw member, in each of the screw-fixing portions, two projections are formed on a board surface of the base plate, the two projections are separately formed from each other in order that the screw member and the base plate are in contact with each other at two contacting points respectively formed by the two projections, in each of the screw-fixing portions, the two projections are located at such positions, which are symmetric with respect to a center of the through-hole formed in the base plate, and the two projections in each of the screw-fixing portions are located at such positions, which are symmetric with respect to a line connecting a base-plate center and the screw-hole center.

10. The electronic device according to claim 9, wherein the number of the projections is solely two, and each of the two projections does not enter the housing or the screw member.

11. An electronic device comprising:

a base plate, which has multiple through-holes and to which multiple electronic components are soldered;

a housing having multiple screw holes and accommodating the base plate;

multiple screw members, each of which is inserted through each of the through-holes of the base plate and screwed into each of the screw holes of the housing for fixing the base plate to the housing; and multiple washers, each of which is attached to each of the screw members, wherein:

the electronic device has multiple screw-fixing portions, at each of which the base plate is respectively fixed to the housing by the screw member, in each of the screw-fixing portions, two projections are formed at a contact surface portion of the washer, the two projections are separately formed from each other in order that the screw member and the base plate are in contact with each other via the washer at two contacting points respectively formed by the two projections, in each of the screw-fixing portions, the two projections are located at such positions, which are symmetric with respect to a center of the screw member, and the two projections in each of the screw-fixing portions are located at such positions, which are symmetric with respect to a line connecting a base-plate center and the screw-hole center.

12. The electronic device according to claim 11, wherein the number of the projections is solely two, and each of the two projections does not enter the housing or the base plate.

* * * * *